United States Patent
Reed et al.

(10) Patent No.: US 8,370,091 B2
(45) Date of Patent: Feb. 5, 2013

(54) COMPUTER-IMPLEMENTED SYSTEMS AND METHODS FOR DETECTING ELECTROSTATIC DISCHARGES AND DETERMINING THEIR ORIGINATION LOCATIONS

(75) Inventors: C. Christopher Reed, El Segundo, CA (US); Tom R. Newbauer, Claremont, CA (US); Richard Briët, Cypress, CA (US)

(73) Assignee: The Aerospace Corporation, El Segundo, CA (US)

( * ) Notice: Subject to any disclaimer, the term of this patent is extended or adjusted under 35 U.S.C. 154(b) by 327 days.

(21) Appl. No.: 12/808,000

(22) Filed: Sep. 17, 2010

(65) Prior Publication Data

US 2012/0072139 A1    Mar. 22, 2012

(51) Int. Cl.
*G06F 19/00* (2011.01)
(52) U.S. Cl. .......................................... 702/59
(58) Field of Classification Search .............. 702/59, 702/182–185
See application file for complete search history.

(56) References Cited

U.S. PATENT DOCUMENTS

| | | | |
|---|---|---|---|
| 6,064,340 A * | 5/2000 | Croft et al. | 342/460 |
| 6,118,419 A * | 9/2000 | Smith et al. | 345/84 |
| 6,175,238 B1 | 1/2001 | Lin | |
| 6,194,651 B1 | 2/2001 | Stark et al. | |
| 6,243,243 B1 | 6/2001 | Gelderloos et al. | |
| 7,657,858 B2 * | 2/2010 | Chen et al. | 716/120 |
| 2008/0134119 A1 * | 6/2008 | Chen et al. | 716/9 |
| 2008/0148199 A1 * | 6/2008 | Bell et al. | 716/5 |
| 2010/0051502 A1 * | 3/2010 | Cybulski et al. | 206/710 |
| 2010/0051692 A1 * | 3/2010 | Knudson et al. | 235/439 |
| 2010/0090676 A1 * | 4/2010 | Enta | 324/66 |
| 2010/0127782 A1 * | 5/2010 | Karp | 330/298 |
| 2012/0074978 A1 * | 3/2012 | Gentrup et al. | 324/754.19 |

OTHER PUBLICATIONS

Paasi, "Electrostatic Discharge of Charged Electronic Modules," (8 pages), The 2$^{nd}$ Nordic ESD Conference, Karlskoga, Sweden, Sep. 5-6, 2006.
Clevenger, "Evaluation of ESD Suspectibility of Solar Cells with a Monolithic Bypass Diode," 1-4244-0016-3/06, IEEE (2006), pp. 1931-1934.
"Simulation of Current Filament During Electrostatic Discharge Pulse," Copyright © 2007, Synopsys, Inc., (7 pages).
Kuper, "Suppresson and Origin of Soft ESD Failures in a Submicron CMOS Process," Journal of Electrostatics 33 (1994) pp. 313-325.
Takai, "One of the Methods of Observing ESD Around Electronic Equipments," EOS/ESD Symposium 96-186, pp. 4.3.1-4.3.7, Japan.
Lin, "A Robust ESD Event Locator System with Event Characterization," Journal of Electrostatics 44 (1998) pp. 159-175.

(Continued)

*Primary Examiner* — Edward Raymond
(74) *Attorney, Agent, or Firm* — K & L Gates LLP (57) ABSTRACT

Computer-implemented systems and methods for detecting ESD on a surface and determining an origination location of the ESD. A programmed computer device monitors time-varying current data related to the surface to detect ESD on the surface. The current profile for the surface may be compared to a catalog of ESD current profiles, where each ESD current profile in the catalog corresponds to a different location on the surface. The location on the surface whose corresponding ESD current profile best matches the actual current profile from the ESD may be determined to be the origination location of the ESD. Moderately different processes may be used to determine the ESD origination location depending on whether the surface is symmetrical or irregular, flat or curved, etc.

19 Claims, 10 Drawing Sheets

OTHER PUBLICATIONS

Li, "Research of Electrostatic Discharge (ESD) Pulse Injection System," 6th Spacecraft Charging Technology Conference, AFRL-VS-TR-20001578, Sep. 1, 2000, pp. 103-106.

Okumura, "International Round-Robin Tests on Solar Cell Degradation Due to Electrostatic Discharge," Journal of Spacecraft and Rockets, vol. 47, No. 3, May-Jun. 2010, pp. 533-541.

Roth, "Relevance of Ground-Based Electron-Induced Electrostatic Discharge Measurements to Space Plasma Environments," (13 pages), 1st AIAA Atmospheric and Space Environments Conference, Jun. 22-25, 2009, San Antonio, TX, AIAA 2009-3527.

*Avoiding Problems Caused by Spacecraft On-Orbit Internal Charging Effects*, NASA Technical Handbook, NASA-HDBK-4002, Feb. 17, 1999.

* cited by examiner

COMPUTER-IMPLEMENTED SYSTEMS AND METHODS FOR DETECTING ELECTROSTATIC DISCHARGES AND DETERMINING THEIR ORIGINATION LOCATIONS

STATEMENT REGARDING FEDERALLY SPONSORED RESEARCH

This invention was made with government support under Contract No. FA8802-09-C-0001 awarded by the United States Air Force. The government has certain rights in the invention.

BACKGROUND

Electrostatic discharges (ESD) on solar cells are triggered when electrical field strengths become high enough to induce the transport of charges. Subsurface blisters, voids, and other manufacturing defects, as well as metal "whiskers" can, in a charging environment, produce the field strengths needed to induce an electrostatic discharge. Micrometeoroid impacts are another potential trigger for ESD. Similar mechanisms apply to other exposed satellite surfaces. ESD accounts for more than 50% of anomalies on space systems in orbit. These anomalies can include: (i) anomalous communication due to broadband noise interference; (ii) contamination due to material degradation; (iii) power loss; and (iv) damage to electronic components. No viable techniques for locating the origination point of ESD events were ever implemented, yet knowing where ESD events originate would be useful in developing mitigation of anomalies due to ESD on future space systems, and in improving operating procedures of current and future space systems.

SUMMARY

In one general aspect, the present invention is directed to computer-implemented systems and methods for detecting ESD on a surface and determining the origination location of an ESD. The surface may be, for example, a solar panel. In various embodiments, a programmed computer device monitors time-varying current data, i.e., current transients, related to the surface to detect ESD on the surface. Also, the current profile or signature for the surface (i.e., the variation of current level over a time period) may be compared to a catalog of ESD current profiles, where each ESD current profile in the catalog corresponds to a different location on the surface (e.g., the solar panel). The location on the surface whose corresponding ESD current profile best matches the actual current profile from the ESD determines the origination location of the ESD. Moderately different processes may be used to determine the ESD origination location depending on the shape of the surface, i.e., whether it is symmetrical or irregular, flat or curved in three dimensions, etc.

FIGURES

Various embodiments of the present invention are described herein in conjunction with the following figures, wherein.

DESCRIPTION

Various non-limiting embodiments of the present disclosure will now be described to provide an overall understanding of the principles of the structure, function, manufacture, and use of the systems and methods for detecting ESD and determining the origination location of ESD disclosed herein. One or more examples of these non-limiting embodiments are illustrated in the accompanying drawings. It will be appreciated that the systems and methods specifically described herein and illustrated in the accompanying drawings are non-limiting example embodiments and that the scope of the various non-limiting embodiments of the present disclosure are defined solely by the claims. The features illustrated or described in connection with one non-limiting embodiment can be combined with the features of other non-limiting embodiments. Such modifications and variations are intended to be included within the scope of the present disclosure.

The systems and methods described herein may be used to detect ESD and ESD origination location on a dielectric surface or material. In general, the embodiments described below are described in the context of detecting ESD and determining the origination location of ESD for solar panels, such as solar panels used to accumulate energy to power a space craft (such as a satellite), although it should be recognized that the embodiments of the present invention are not necessarily so limited, and that systems and methods may be applied to different types of surfaces that are subject to ESD, including other spacecraft surfaces (such as surfaces of exposed payloads) as well as non-spacecraft surfaces. In addition, the subject surfaces may be flat or non-flat.

For spacecraft, real-time, in-orbit detection of ESD and determination of ESD origination location are beneficial, for example, because it may allow determination of whether the ESD interfered with communications. Prior to space use, ESD evaluation of a spacecraft may help identify weak points in the design of the craft that can be addressed prior to space deployment of the craft. In post-flight analysis, the position and orientation (pose) of the craft at times of ESD may be analyzed to determine a correlation between pose of the craft, the space environment, and the origination location of the ESD.

Figure 1:
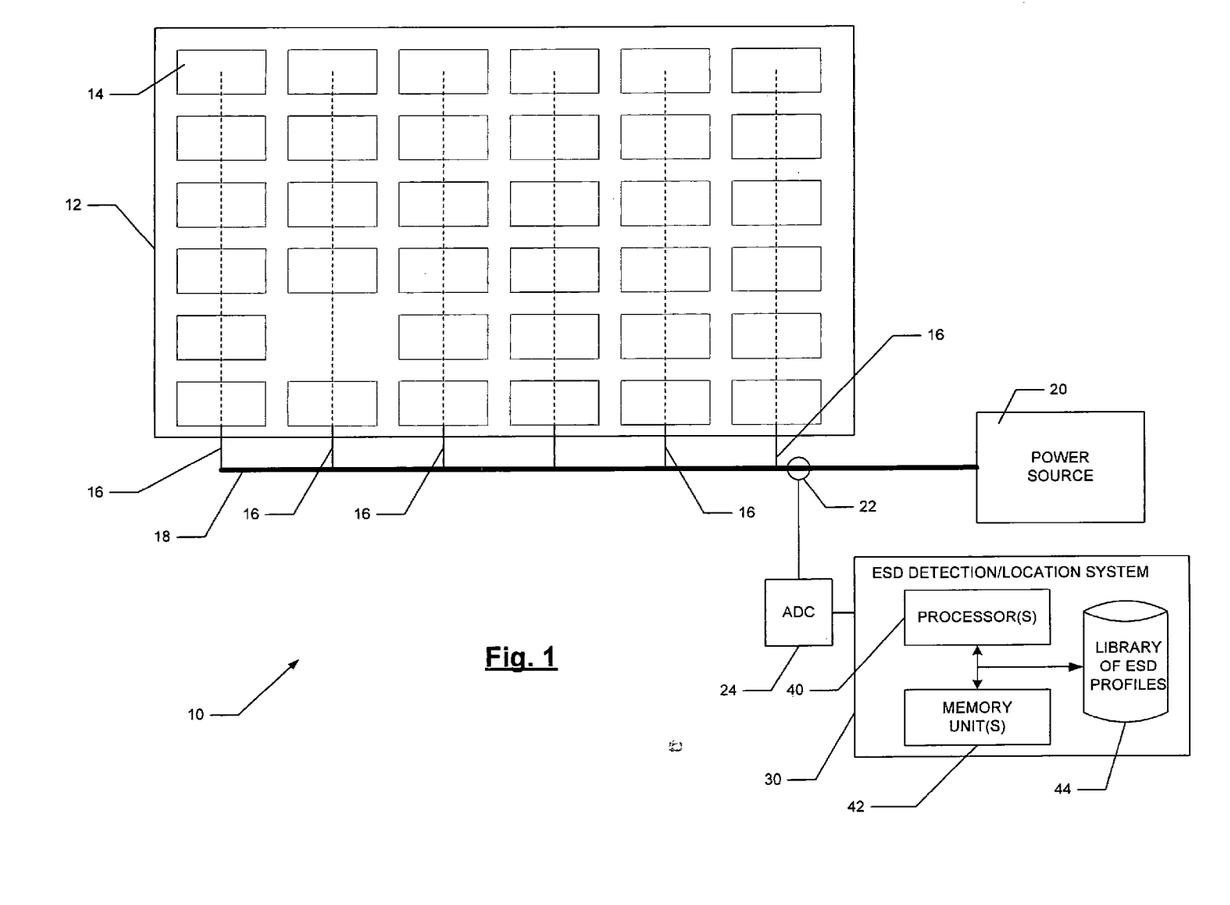
FIGS. 1 and 7 are diagrams of systems for detecting ESD and determining the origination location of the ESD on a solar panel according to various embodiments of the present invention.

In various embodiments, moderately different techniques are used depending on whether the solar panels are symmetric or not. FIG. 1 is a block diagram of a system 10 for detecting ESD and determining the origination location of ESD for an asymmetric solar panel 12, which solar panel 12 may used to accumulate power for a space craft, such as a satellite. The solar panel 12 may comprise an array of solar cells 14. The solar cells 14 preferably comprise a dielectric material and are located on top of a conductive substrate material of the solar panel 12.

The panel array 12 shown in FIG. 1 has six (6) columns of solar cells 14, although in other embodiments fewer or more columns of solar cells 14 may be used. Also, the columns have five (5) or six (6) solar cells 14 in FIG. 1, although in other embodiments fewer or more solar cells per column may be used. In addition, the layout of the solar cells 14 in the panel array 12, as well as the shape of the solar cells 14 themselves, is illustrative in FIG. 1, and in other embodiments, the layout of the solar cells 14 in the panel array 12 and/or the shape of the individual solar cells 14 may be different. The panel array 12 shown in FIG. 1 is asymmetric because the fifth column of solar cells only has five (5) solar cells 14, whereas the other columns have six (6) solar cells 14. In other embodiments, different asymmetric patterns may be utilized.

Groups of solar cells 14, such as respective columns of the panel array 12, may be connected to a common paired-wire string 16. Each of the paired-wire strings 16 may be electrically coupled to a power bus 18. The power bus 18 may be connected to a rechargeable power source 20, such as a rechargeable battery pack. The rechargeable power source 20 may be used to power electronic systems of the spacecraft. The solar cells may convert light energy to direct current electricity by the photovoltaic effect. The paired-wire strings 16 may conduct the current from their associated group of solar cells 14, and the power bus 18 may conduct the cumulative current from the paired-wire strings 16.

The system 10 may comprise a current probe 22, which senses the current in the power bus 18. Any suitable type of current probe may be used. The time-varying analog output from the current probe 22 may be converted to digital values proportional to the current in the power bus by analog-to-digital converter (ADC) 24. The digital values may be input to a programmable ESD detection/location system 30, which, based on the received digital values, detects ESD in the solar panel 12 and the origination location of the ESD.

The ESD detection/location system 30 may be implemented as a computer device, such as a desktop computer, a laptop computer, a server, a mainframe, a workstation, a mobile computing device, a microcontroller, a system-on-chip (SOC), or any other programmable computing device capable of detecting ESD and determining the origination location based on the digital value inputs. As shown in FIG. 1, the ESD detection/location system 30 may comprise one or more processors 40 (such as a microprocessor), as well as one or more memory units 42. The memory units 42 may comprise primary memory units, such as volatile and/or non-volatile semiconductor or magnetic integrated circuit memory chips (RAM and/or ROM), as well as secondary memory units, such as a hard disk drive or an optical disk drive. The memory units 42, such as the primary memory units, may store software code that is executed by the processor(s) 40. In addition, the ESD detection/location system 30 may comprise a database 44 that stores a library of ESD signature profiles. The database 44 may be stored in primary or secondary memory units, for example. The ESD signature profiles may comprise data indicative of the current discharge profile (e.g., the change in current over time) for ESD events originating from various points on the solar panel 12. That is, for example, for each of a number of different location points on the solar panel 12, the library 44 may have a corresponding current discharge profile. The current discharge profiles may be obtained beforehand according to methods described below, for example. The different location points for which corresponding current discharge profiles are captured and stored may be arranged in a grid, for example.

Figure 2:
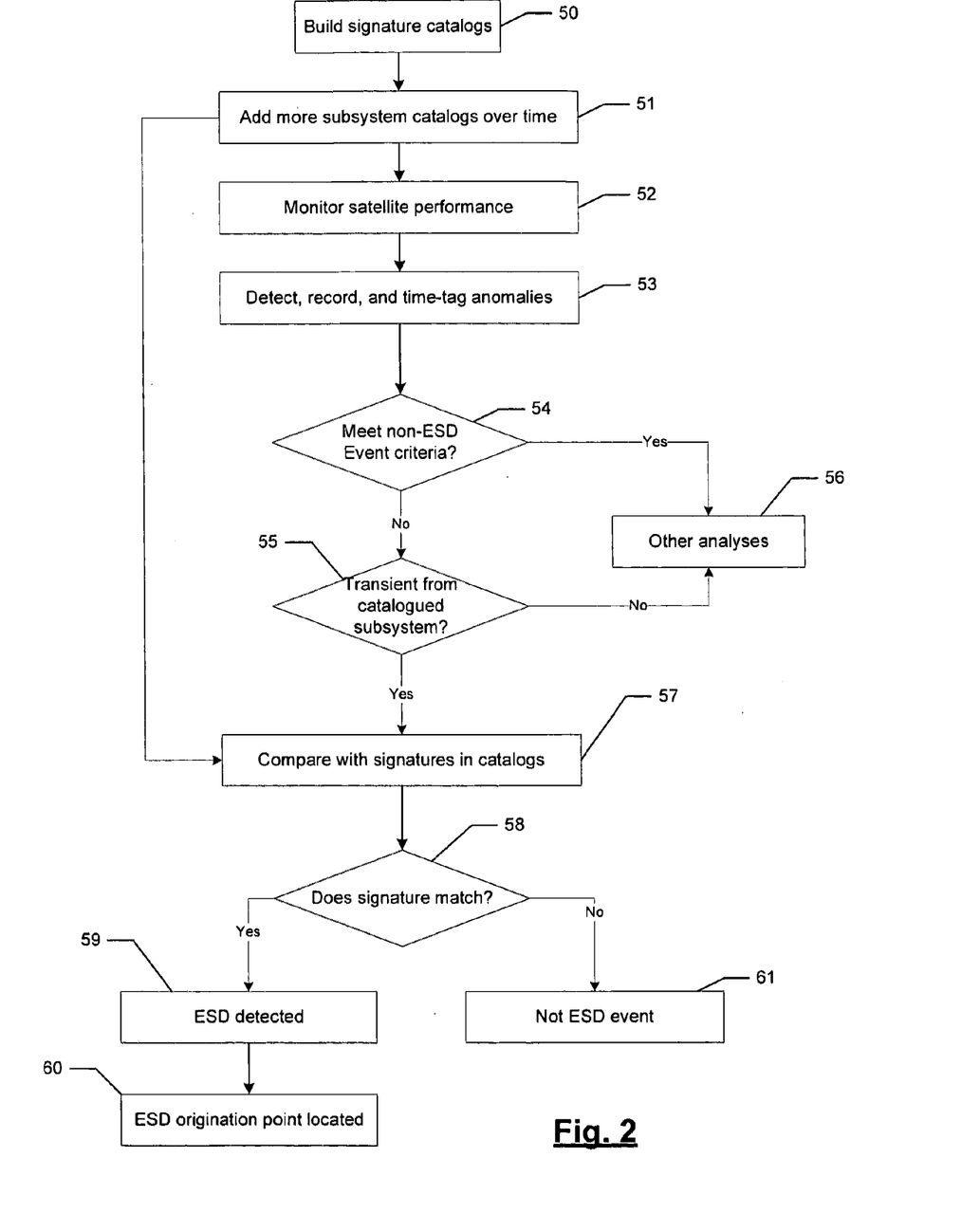
FIGS. 2 and 8 are flowcharts of process flows of a computer system for determining the origination location of the ESD according to various embodiments of the present invention.

FIG. 2 is a block diagram of a process by which signature catalogs may be built, and by which ESD detection and location may be performed by the ESD detection/location system 30 when executing the software stored in the memory units 42 according to various embodiments of the present invention. The process flow illustrated in FIG. 2 may be used to detect ESD and determine the origination location of the ESD for an asymmetric surface, such as solar panel 12 in FIG. 1. Steps 50 and 51 involve building sub-system-specific catalogs of location-dependent signatures for satellite subsystems, such as solar panels, thermal control surfaces, thermal blankets, and antenna dishes. The process of building additional subsystem catalog will in general be an on-going process, represented by step 51.

Steps 52 through 56 involve satellite-related activities whose net effect is to screen out non-ESD-related anomalies and present current data from potential ESD-related transients to the ESD detection/location system 30. These activities, which include signal-processing, may be performed by an on-board computer system of the spacecraft, for example. These activities include (a) recording current transients on electrical wiring from power buses, signal lines, and command and control lines, as well as information about satellite state of health, the execution of programmed commands, and the response of the satellite to command and control signals from ground stations (step 52), (b) finding and reporting current transients that fall within a specified time window of an observed anomaly (step 53), (c) screening out non-ESD events via constraints on pulse width, rise time, fall time, and/or peak current (step 54), and (d) screening out transients on lines from non-catalogued subsystems (step 55). If the current transients do not meet the pulse width, rise time, fall time, and/or peak current constraints for an ESD event at step 54, or if the transients are not from one of the craft subsystems for which there is no catalog of ESD profiles at step 55, other analyses at block 56 may be necessary to determine the cause of the transient.

According to various embodiments, the ESD detection/location system 30 receives pre-screened current data associated with anomalies that may be ESD-related (based on the screenings at steps 54 and 55, for example). If the ESD detection/location system 30 is used for post-flight analysis, the pre-screened current data may be stored in a database of the on-board computer of the spacecraft so that the data can be accessed by the ESD detection/location system 30 after the conclusion of the flight. If the ESD detection/location system 30 is on-board, it may receive the current data in real time during operation of the spacecraft. In yet other embodiments, the pre-screened current data may be transmitted from the on-board computer of the spacecraft to the ESD detection/location system 30 via a data network.

For each detected transient meeting the screening criteria, the ESD detection/location system 30 compares at step 57 the actual current discharge profile (e.g., the data indicating how current changes with time for the ESD event) to each of the stored ESD signature profiles in the library 44 to determine the best match. For the purposes of this discussion, the absolute value of the area bounded between the two current profiles is referred to as the "distance" between these profiles. Thus, the smaller the "distance," the closer the two profiles are to each other, i.e., the more closely they match. In other embodiments, a different mathematical technique may be used to determine the best match to the actual current discharge profile. If the catalog signature that best matches the signature of interest (e.g., the one that minimizes the "distance" to the signature of interest) also meets an appropriate ("distance") threshold criterion at step 58, then the ESD detection/location system 30 may determine that an ESD event has been detected at step 59 involving the subsystem in question, whose approximate location is given by the location of the aforementioned catalog signature (step 60). If no match is found that meets the "distance" threshold criterion (step 58), then the observed signature may be determined to not be an ESD transient (step 61).

The ESD detection/location system 30 may receive the current data in real-time or non-real-time. For non-real-time, the current data for the power bus 18 may be stored in a computer database or other computer data store, and the ESD detection/location system 30 may analyze the data when the data is input to the ESD detection/location system 30. That way, the ESD detection/location system 30 could be located remotely from the solar panel 12 when the solar panel 12 is in use, although in other embodiments, the ESD detection/location system 30 could be located with or nearby to the solar panel 12. The current data may also have corresponding time data (e.g., a timestamp), for example, that indicates the current levels at each discrete time increment or time stamp (e.g., after the analog-to-digital conversion by ADC 24 in FIG. 1). Also, the current data may be transmitted to the ESD detection/location system 30 via a wired and/or wireless electronic data network.

Figure 3A:
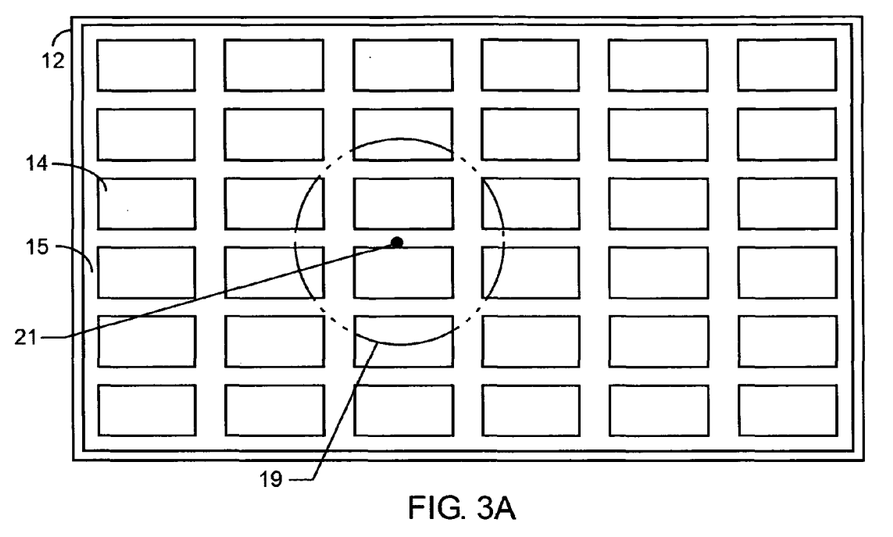
FIGS. 3A-3B illustrate a spherical plasma neutralization wave sweeping over a solar panel over time.
Figure 3B:
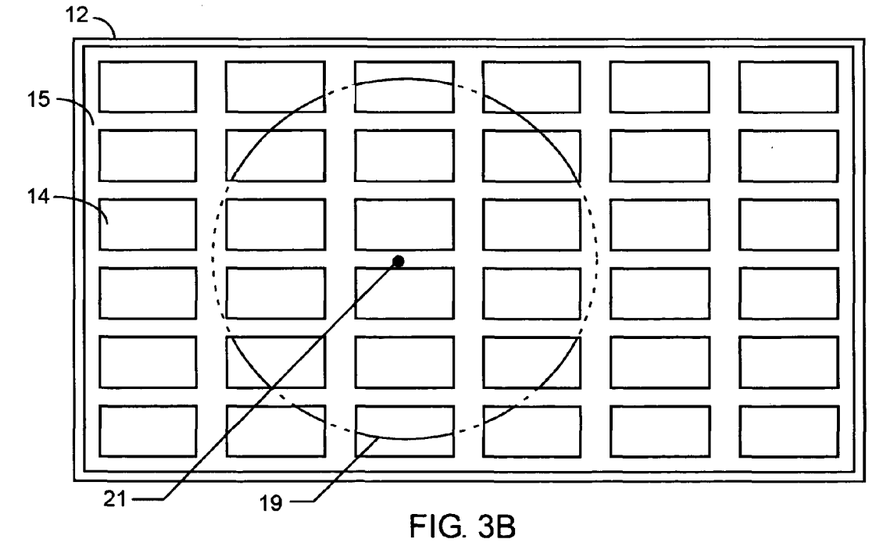

For the purposes of this discussion, as shown in FIG. 3A, a solar panel 12 may be thought of as a flat substrate 15 made of conductive material, on top of which have been placed a number of solar cells 14, made of dielectric material. In space the solar panels are in a charging environment that continually deposits charge on any exposed surfaces. The substrate 15 does not accumulate charge because it is conductive, and any charge deposited immediately gets discharged to ground. The solar cells 14, on the other hand, accumulate charge because they are made of dielectric material. As shown in FIGS. 3A-B, when an electrostatic discharge starts, a spherical plasma neutralization wave 19 is created from an origination point 21, and the wave 19 sweeps and neutralizes charge on the dielectric solar cells 14 as it expands over time. It has been observed that the plasma wave does not expand at a constant rate. See H. Masui, et al. "Laboratory test campaign for ISO standardization of solar array ESD test methods," Paper AIAA 2007-277, 45th Aerospace Sciences Meeting, 8-11 Jan. 2007, Reno, Nev.; M. Cho, "Laboratory experiment at KIT for solar array ESD test standardization," presentation given at The Aerospace Corporation, 5 Jan. 2007. FIG. 3A shows the spherical plasma neutralization wave 19 at an instant in time prior to that shown in FIG. 3B, as the spherical plasma neutralization wave 19 is expanded in FIG. 3B relative to FIG. 3A. This process of neutralizing the charge on the solar cells is what creates the discharge current profile. Wherever this expanding circle intersects a solar cell, discharge current will be created. The amount of current generated will be proportional to the circular arc length that intersects the solar cell 14. In FIGS. 3A-B, the locations where the expanding circle intersects a solar cell 14 are shown in solid line, and non-intersection locations are shown with dashed line. The total discharge current will be proportional to the sum of the arc lengths of the solid line arc segments. As the circle expands over time, its intersection with the solar cells 14 will change (either increase or decrease), producing a current-versus-time signature that is unique to the point of origination. Thus, different origination points will produce different signatures. In general, the current will be very small initially because the size of the wave is small and will be very small at the end because the wave will expand past the panel 12. In between, the current may fluctuate between local peaks and valleys.

This method may also be applied to irregular flat surfaces, and, with slight modifications, to curved surfaces in three dimensions as well. In three dimensions the expansion of the plasma neutralization wave may be blocked in certain directions on account of the presence of bumps or other obstacles. In these directions the wave will not propagate beyond the obstacle in question. More specifically, a ray drawn in any direction from the origin of the discharge will only propagate up to the point where it encounters an obstacle. The result will be an expanding spherical wave in which certain sections get blocked out or removed as the wave expands. However, the total discharge current will still be proportional to the sum of the 3D arc lengths of the intersection of the resulting wave with any dielectric surfaces.

Figure 4:
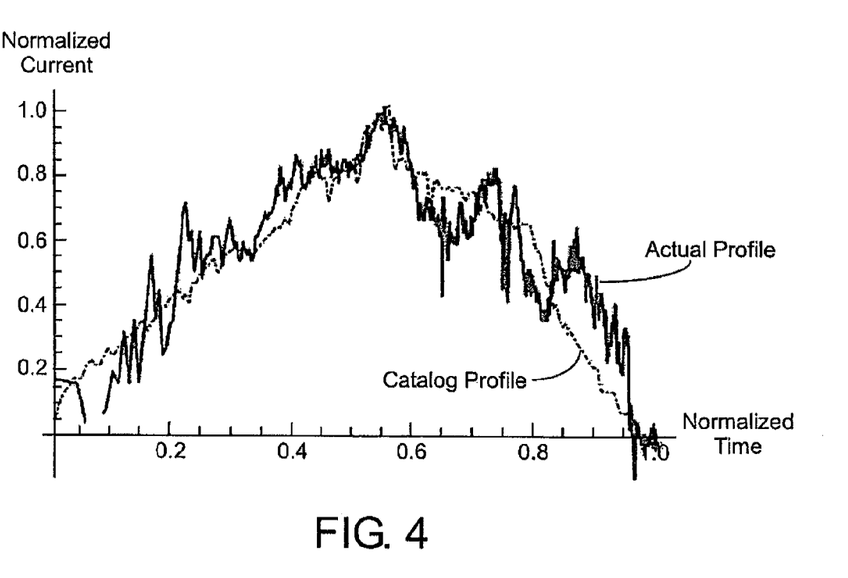
FIG. 4 is a graph showing an example comparison between an actual current profile and a single ESD current profile in a catalog.

According to various embodiments, the ESD detection/location system 30 may compare the actual current discharge profile to the stored ESD signature profiles to determine the best match by computing the area between the two profiles. The ESD signature profile having the least difference relative to the actual current discharge profile may be considered to be the best match. FIG. 4 is a graph illustrating an example actual current discharge profile and a single catalog ESD signature profile. As seen in the example of FIG. 4, the current levels change with time. In other embodiments, a different mathematical technique may be used to determine the best match to the actual current discharge profile.

In various embodiments, the library of ESD signature profiles stored in the database 44 for a particular solar panel 12 is determined by mathematical modeling. Hypothetical ESD signature profiles may be generated by an appropriately programmed computer system using observed and published plasma expansion rates together with a mathematical model based on, for example, the description associated with FIGS. 3A-B, to determine the expected ESD signature profile for ESD events originated at various points on the solar panel. If the surface is not flat, the model is more complicated, but follows the same general principles. As can be seen, the catalog 44 of ESD profiles may be tailored to the specific surface of interest for more robust analysis.

Figure 5:
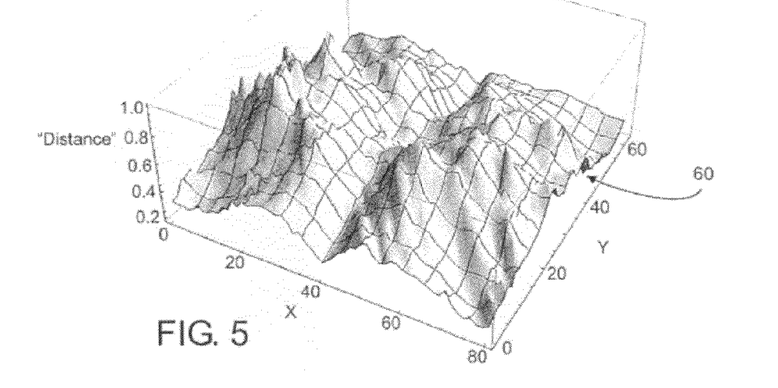
FIGS. 5 and 10 are graphs showing exemplary comparison results between an actual current profile and each ESD current profile in a catalog.
Figure 6:
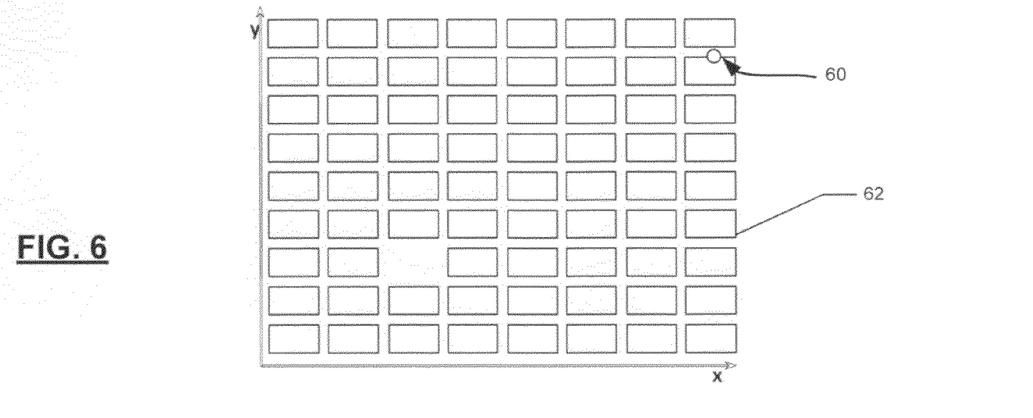
FIGS. 6 and 9 are notional diagrams of solar panels.

FIG. 5 is an example 3D graph showing the area bounded between an actual current profile for the power bus 18 and each ESD signature profile in a particular ESD signature profile library 44. Finding the best match, i.e., the least area difference between the profiles; is analogous to finding the lowest point in the 3D graph of FIG. 5. In the illustrated example, the lowest point corresponds to point 60. The ESD signature profiles may be for the example solar panel 62 shown in FIG. 6. In this example, point 60, which corresponds to the approximate origination location of the ESD event, is in the upper right-hand corner portion of the solar panel 62.

An advantage of the system described above is that, other than possibly the current probes, there is little additional hardware, if any, required to detect the ESD and determine the ESD origination location. This is an important advantage, especially for spacecraft, where reducing the weight of the craft is critical.

Figure 7:
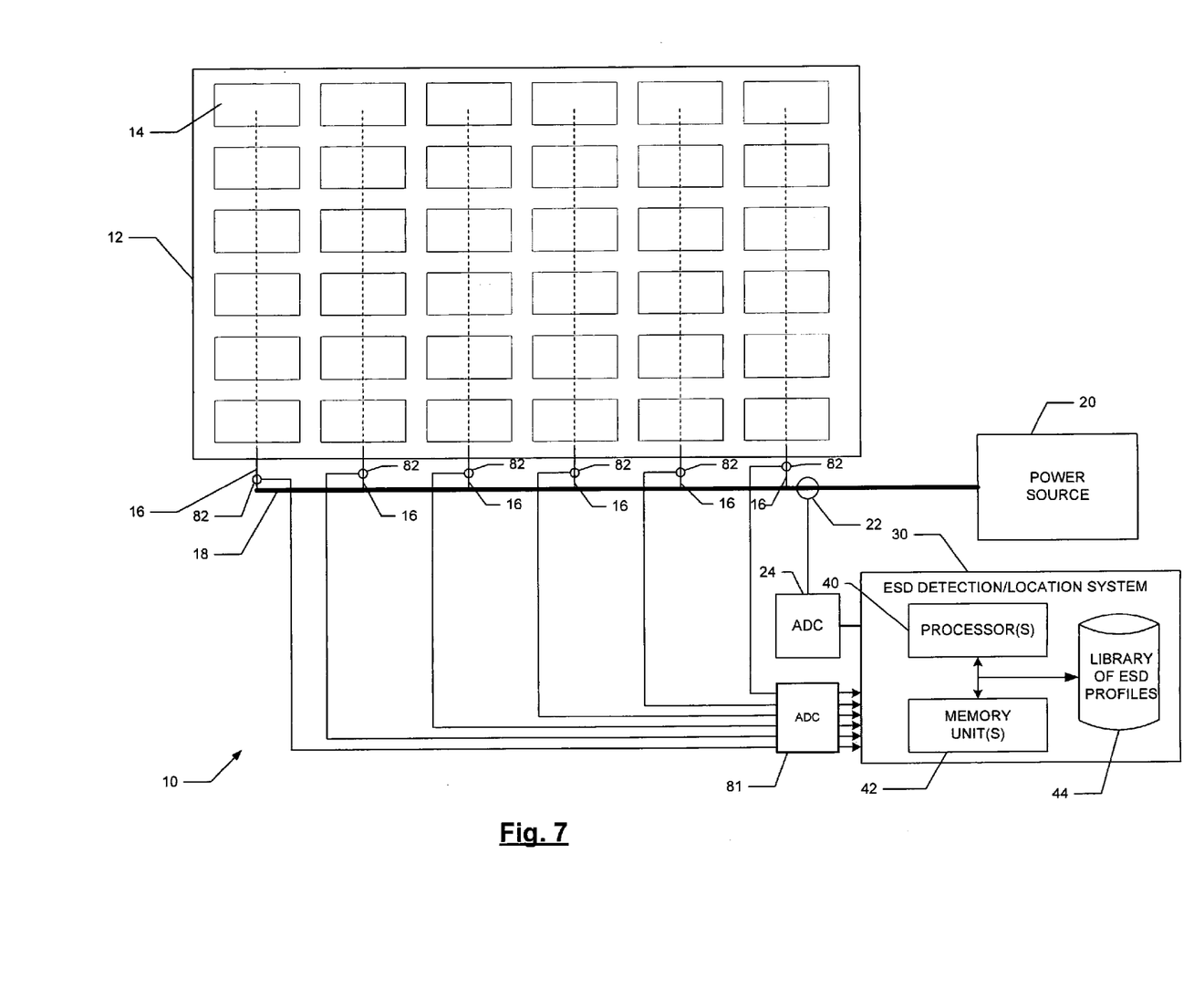

When the solar panel is symmetrical (i.e., having one or more axes of symmetry), the current profiles (actual or hypothetical) for different points on panel 12—points equidistant from the center of the axis of symmetry—may be identical or significantly similar (i.e., less than the acceptable margin of error, such as within 1% or some other threshold). Thus, there may be multiple "best matches" between the actual current profile and catalog profiles, such as two best matches for each axis of symmetry. Additional information may be needed to "break the symmetry." FIG. 7 is a diagram of system 10 for detecting ESD and determining the origination location of ESD for a symmetric solar panel 72. In the example of FIG. 7, the solar panel has one vertical axis of symmetry. In such an embodiment, the ESD detection/location system 30 may use current data from the strings 16 to break the symmetry. Accordingly, in various embodiments, two or more of the strings 16 may have an associated current probe 82, whose outputs are input (via ADC 81) to the ESD detection/location system 30. The symmetry may be broken based on the time at which the ESD was detected in the various strings 16; the string 16 where the ESD event was first detected may be closest to the ESD location.

Figure 8:
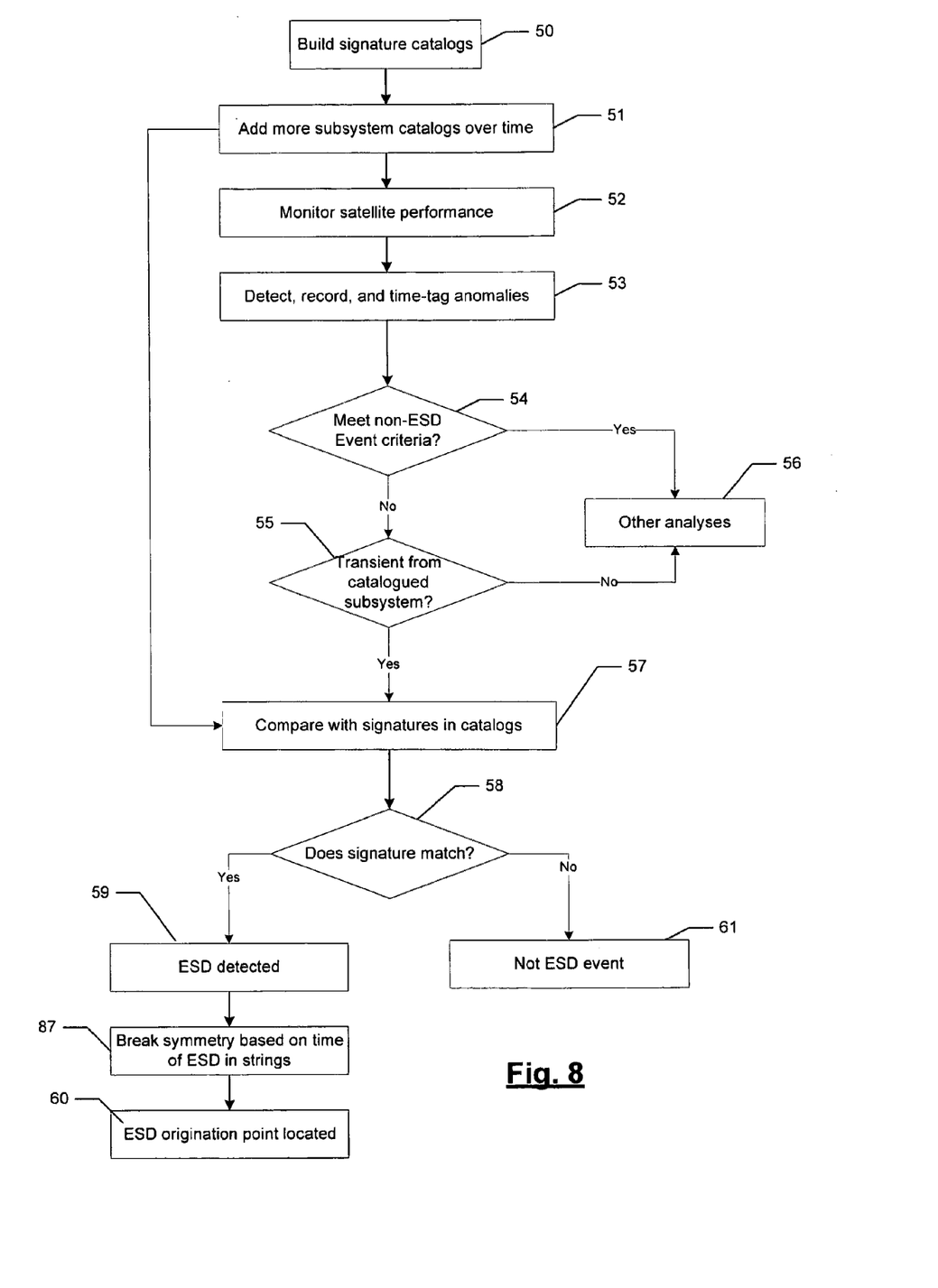
Figure 9:
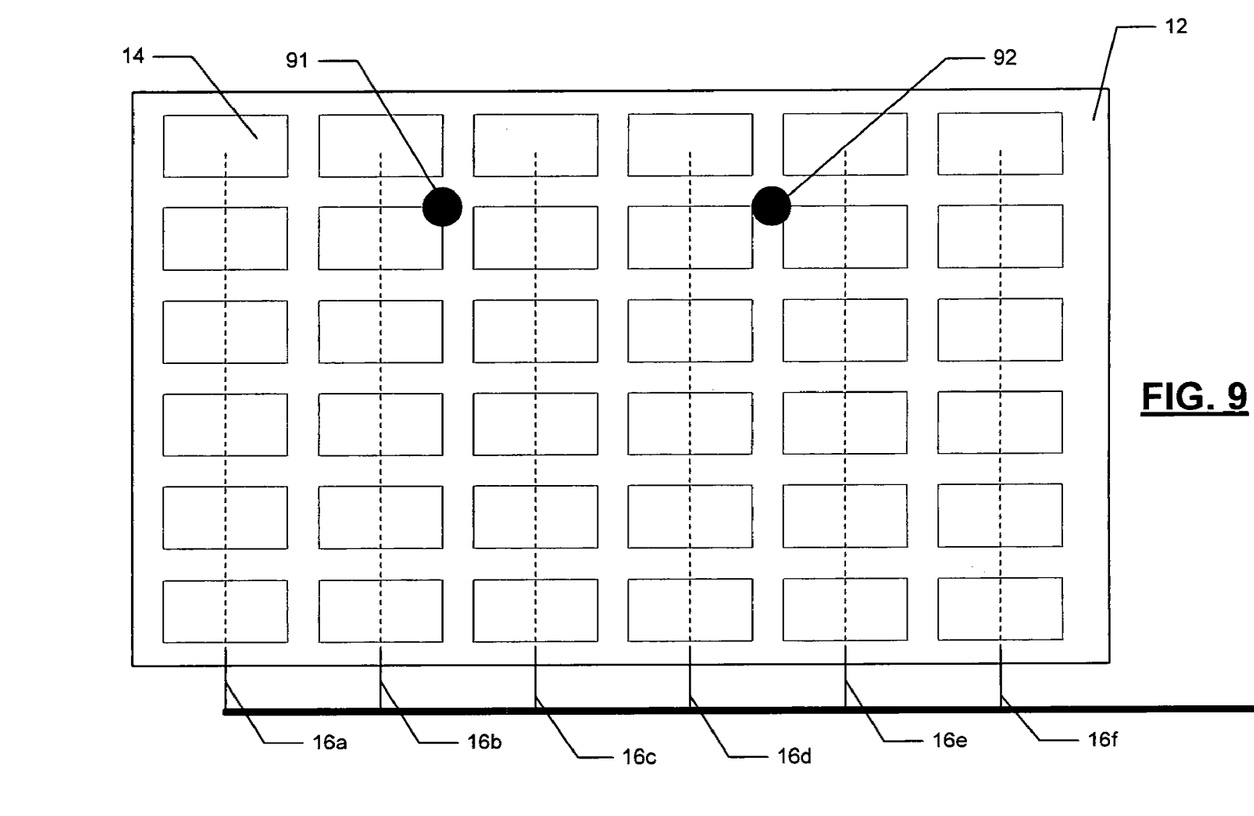

FIG. 8 is a diagram of the process flow through the ESD detection/location system 30 for determining the origination location of ESD for a symmetric solar panel 12. The process flow of FIG. 8 is similar to that of FIG. 2 described above, except that FIG. 8 includes the additional step 87. In FIG. 8, because of the symmetry in the solar panel 12, there might be two possible origination locations for an ESD event, as shown in the example of FIG. 9, where ESD origination locations 91, 92 may have the same current profile. Thus, their respective distances with respect to the current profile of interest may be identical or substantially similar. If the actual ESD origination location were location 91 in FIG. 9, the current spike would be detected time-wise in strings 16b-c before strings 16d-e. Based on this timing difference of the current spikes in the strings 16, at step 87 in FIG. 8, the ESD detection/location system 30 determines that the origination location is the best match that is closer to strings 16b-c, or ESD origination location 91, in this example.

Figure 10:
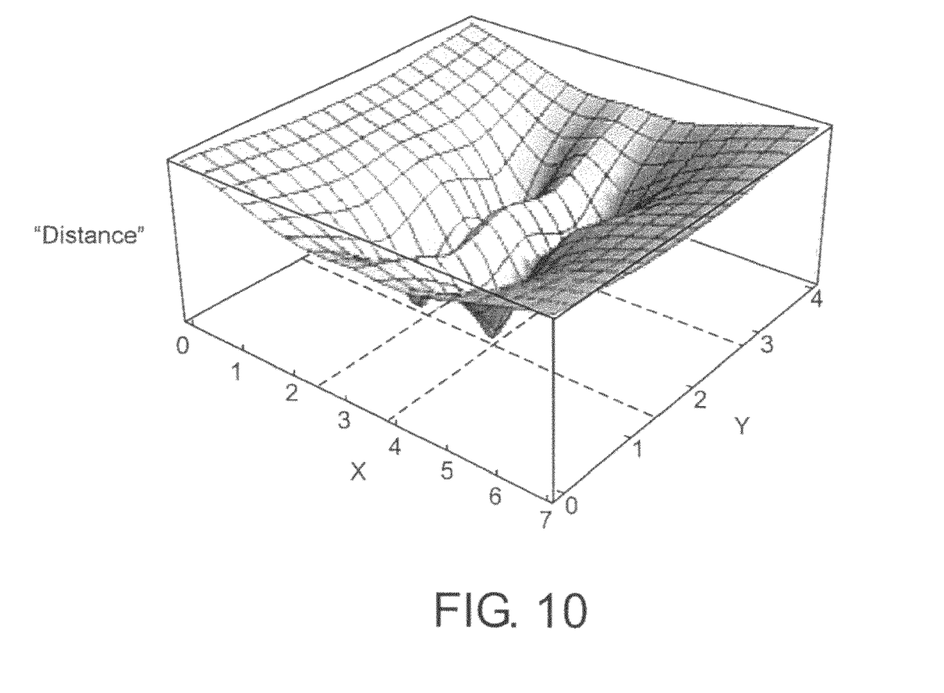

FIG. 10 is a 3D graph showing example results of the comparison between the catalog of ESD profiles and the actual current profile for a solar panel have two axes of symmetry. As such, there are four "best matches." The ESD detection/location system 30 can determine which of the four best matches is the ESD origination location based on when in time the current spikes caused by the ESD are detected in the current strings 16; the string(s) where the ESD is detected first in time is (are) closer to the actual ESD origination location.

Figure 11:
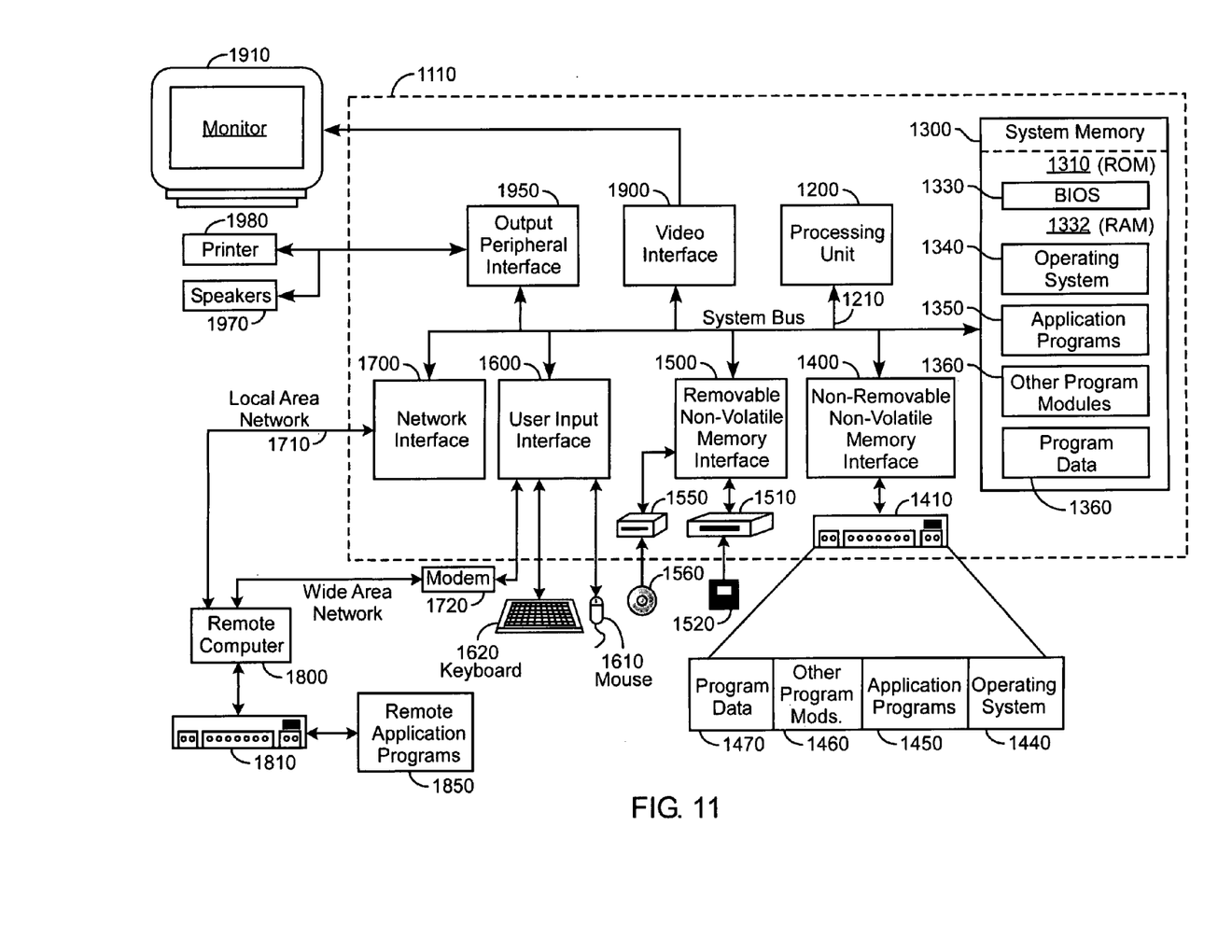
FIG. 11 is a diagram of a computing environment that may be used according to various embodiments of the present invention.

FIG. 11 and the following discussion are intended to provide a brief general description of a suitable computing environment in which the described embodiments of the ESD detection/location system 30 may be implemented. It should be understood, however, that handheld, portable, and other computing devices and computing objects of all kinds are contemplated for use in connection with the described embodiments. FIG. 11 illustrates one example of a suitable computing system environment 1000 in which the described embodiments may be implemented, such as for the ESD detection/location system 30. Although as made clear above, the computing system environment 1000 is only one example of a suitable computing environment and is not intended to suggest any limitation as to the scope of use or functionality of the described embodiments. Neither should the computing environment 1000 be interpreted as having any dependency or requirement relating to any one or combination of components illustrated in the operating computing environment 1000. With reference to FIG. 11, one embodiment of a system for implementing the described embodiments comprises a general-purpose computing device in the form of a computer system 1100. Components of the computer system 1100 may comprise a processing unit 1200, a system memory 1300, and a system bus 1210 that couples various system components including the system memory 1300 to the processing unit 1200. The system bus 1210 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

The computer system 1100 generally comprises a variety of computer readable media. Computer readable media can be any available media that can be accessed by the computer system 1100 and includes both volatile and nonvolatile media, removable, and non-removable media. Computer storage media includes volatile and nonvolatile, removable, and non-removable media implemented in any method or technology for storage of information such as computer readable instructions, data structures, program modules, or other data. The catalog of ESD current profiles may be stored in non-volatile memory of the computer system 1100. Computer storage media includes, but is not limited to, Random Access Memory (RAM), Dynamic RAM (DRAM), Double-Data-Rate DRAM (DDRAM), Synchronous DRAM (SDRAM), Static RAM (SRAM), Programmable ROM (PROM), Read Only Memory (ROM), Electrically Erasable Programmable Read Only Memory (EEPROM), flash memory, polymer memory such as ferroelectric polymer memory, ovonic memory, phase change or ferroelectric memory, silicon-oxide-nitride-oxide-silicon (SONOS) memory, Compact Disk Read Only Memory (CDROM), Compact Disc-rewritable (CDRW) Digital Versatile Disks (DVD) or other optical disk storage, magnetic cassettes, magnetic tape, magnetic disk storage or other magnetic storage devices, or any other medium which can be used to store the desired information and which can be accessed by the computer system 1100. It is worthy to note that some portion or the entire computer storage medium may be included in other elements of the apparatus computer system 1100. For instance, some or all of computer storage medium may be included on the same integrated circuit or chip with elements of the computer system 1100 (e.g., processing unit 1200). Alternatively, some portion or the entire computer storage medium may be disposed on an integrated circuit or other medium (e.g., a hard disk drive) that is external.

The system memory 1300 includes computer storage media in the form of volatile and/or nonvolatile memory such as ROM 1310 and RAM 1320. A basic input/output system 1330 (BIOS), containing the basic routines that help to transfer information between elements within the computer system 1100, such as during start-up, is typically stored in the ROM 1310. The RAM 1320 typically contains data and/or program modules that are immediately accessible to and/or presently being operated on by the processing unit 1200. By way of example, and not limitation, FIG. 11 illustrates an operating system 1340, one or more application programs 1350, other program modules 1360, and program data 1370.

The computer system 1100 also may comprise other removable/non-removable, volatile/nonvolatile computer storage media. By way of example only, FIG. 11 illustrates a hard disk drive 1410 that reads data from or writes data to non-removable, nonvolatile magnetic media, a magnetic disk drive 1510 that reads data from or writes data to a removable, nonvolatile magnetic disk 1520, and an optical disk drive 1550 that reads data from or writes data to a removable, nonvolatile optical disk 1560, such as a CDROM, CDRW or other optical media. Other removable/non-removable, volatile/nonvolatile computer storage media that can be used in the example operating environment include, but are not limited to, magnetic tape cassettes, flash memory cards, digital versatile disks, digital video tape, solid state RAM, solid state ROM, and the like. The hard disk drive 1410 is typically connected to the system bus 1210 through a non-removable memory interface such as interface 1400, and magnetic disk drive 1510 and optical disk drive 1550 are typically connected to the system bus 1210 by a removable memory interface, such as interface 1500.

The drives and their associated computer storage media discussed above and illustrated in FIG. 11 provide storage of computer readable instructions, data structures, program modules, and other data for the computer system 1100. In FIG. 11, for example, the hard disk drive 1410 is illustrated as storing an operating system 1440, one or more application programs 1450, other program modules 1460, and program data 1470. Note that these components can either be the same as or different from the operating system 1340, the one or more application programs 1350, the other program modules 1360, and the program data 1370. The operating system 1440, the one or more application programs 1450, the other program modules 1460, and the program data 1470 are given different numbers here to illustrate that, at a minimum, they are different copies. A user may enter commands and information into the computer system 1100 through input devices such as a keyboard 1620 and pointing device 1610, commonly referred to as a mouse, trackball, or touch pad, and a scanner 1490. Other input devices (not shown) may include a microphone, joystick, game pad, satellite dish, or the like. These and other input devices are often connected to the processing unit 1200 through a user input interface 1600 that is coupled to the system bus 1210, but may be connected by other interface and bus structures, such as a parallel port, game port or a universal serial bus (USB). A display device 1910 or other type of display device is also connected to the system bus 1210 via an interface, such as a video interface 1900, which may in turn communicates with video memory (not shown). In addition to the display device 1910, computer systems also may include other peripheral output devices such as speakers 1970 and a printer 1960, which may be connected through an output peripheral interface 1950.

The computer system 1100 may operate in a networked or distributed environment using logical connections to one or more remote computers, such as a remote computer 1800. The remote computer 1800 may be a personal computer, a server, a router, a network PC, a peer device or other common network node, and typically includes many or all of the elements described above relative to the computer system 1100, although only a memory storage device 1810 has been illustrated in FIG. 11. The logical connections depicted in FIG. 11 include a local area network (LAN) 1710 and a wide area network (WAN) 1730, but may also include other networks/buses. Such networking environments are commonplace in homes, offices, enterprise-wide computer networks, intranets, and the Internet.

When used in a LAN networking environment, the computer system 1100 is connected to the LAN 1710 through a network interface or adapter 1700. When used in a WAN networking environment, the computer system 1100 generally includes a modem 1720 or other means for establishing communications over the WAN 1730, such as the Internet. The modem 1720, which may be internal or external, may be connected to the system bus 1210 via the user input interface 1600, or other appropriate mechanism. In a networked environment, program modules depicted relative to the computer system 1100, or portions thereof, may be stored in the remote memory storage device. By way of example, and not limitation, FIG. 11 illustrates one or more remote application programs 1850 as residing on the memory device 1810. It will be appreciated that the network connections shown are non-limiting examples and other means of establishing a communications link between the computers may be used.

In various embodiments, therefore, the present invention is directed to a computer system for determining the origination location of an electrostatic discharge (ESD) on a surface. The computer system may comprise: at least one processor; a data store in communication with the at least one processor; and at least one memory unit in communication with the at least one processor. The data store stores a plurality of ESD current profiles, each ESD profile corresponding to a different location on the surface. The at least one memory unit includes instructions that are executed by the at least one processor such that the at least one processor is programmed to: receive actual current data indicative of time-varying current conducted by the surface; compare the actual current data to the plurality of ESD current profiles; and determine the origination location of the ESD on the surface based on the comparison.

According to various implementations, the at least one processor is further programmed to detect ESD on the surface based on the actual current data. The surface may be flat or non-flat. It may comprise a solar panel with an array of solar cells. The at least one processor may be further programmed to compare the actual current data to the plurality of ESD current profiles by determining an area bounded between a current profile for the actual current data to each of the plurality of ESD current profiles. The at least one processor may be programmed to determine the origination location of the ESD on the surface by determining that the location on the surface corresponding to the ESD current profile closest to the current profile for the actual current data is the ESD origination location.

In other embodiments, the present invention is directed to an apparatus that comprises at least one solar panel, the at least one solar panel comprising: a plurality of solar cells; and a power bus connected to strings of solar cells, wherein the power bus conducts current generated by the plurality of solar cells. The apparatus further comprises at least one power bus current probe that senses current in the power bus of the at least one solar panel. In addition, the apparatus comprises an ESD detection/location system comprising at least one processor and at least one memory unit, wherein the ESD detection/location system is capable of receiving current data indicative of current on the at least one power bus, wherein the ESD detection/location system is programmed to determine an origination location of ESD on the at least one solar panel by comparing current data input from the at least one power bus current probe to a plurality of ESD current profiles that are stored in a data store of the ESD detection/location system, each ESD profile corresponding to a different location on the at least one solar panel.

According to various implementations, if the at least one solar panel is asymmetrical, the ESD detection/location system is programmed to compare the current data input from the at least one power bus current probe to the plurality of ESD current profiles by determining an area bounded between a current profile for the current data input from the at least one power bus current probe and each of the plurality of ESD current profiles, wherein the origination location of the ESD on the at least one solar panel corresponds to the location on the at least one solar panel whose corresponding ESD current profile has the least bounded area difference relative to the current profile for the current data input from the at least one power bus current probe. The ESD detection/location system may be further programmed to detect ESD on the at least one solar panel based on the current data input from the at least one power bus current probe.

If the at least one solar panel is symmetrical, having n axes of symmetry (n≧1), the apparatus may further comprise: (i) a plurality of conductive strings connected to respective, discrete groups of the plurality of solar cells of the at least one solar panel, wherein the plurality of conductive strings are connected to the power bus; and (ii) a plurality of string current probes, wherein each of the plurality of string current probes is connected to a separate one of the plurality of conductive strings. The ESD detection/location system may be programmed to determine the origination location of the ESD by: (i) determining at least the 2n most probable ESD origination locations by comparing the current data input from the at least one power bus current probe to the plurality of ESD current profiles, wherein the 2n most probable ESD origination locations correspond to the 2n solar panel locations whose corresponding ESD current profiles have the 2n least bounded area differences relative to a current profile for the current data input from the at least one power bus current probe; and (ii) determining the ESD origination location from the 2n most probable ESD origination locations based on current input data from the plurality of string current probes. The ESD detection/location system may be further programmed to detect ESD on the at least one solar panel based on the current data input from the at least one power bus current probe.

In other embodiments, the present invention is directed to a computer-implemented method for determining an origination location of electrostatic discharge (ESD) on a surface. The method may comprise the steps of: (i) receiving and storing actual current data indicative of time-varying current on the surface by a programmable computer device; (ii) comparing by the programmable computer device the received actual current data to a plurality of ESD current profiles stored in a data store for the programmable computer device, wherein each ESD profile corresponds to a different location on the surface; and (iii) determining by the programmable computer device the origination location of the ESD on the surface based on the comparison.

According to various implementations, the method may further comprise detecting by the programmable computer device ESD on the surface based on the actual current data. If the surface is an asymmetrical solar panel that comprises a plurality of solar cells, the programmable computer device receives current data from a power bus current probe that senses current conducted by a power bus, wherein the power bus is connected to the plurality of solar cells. In addition, the step of comparing the received actual current data to the plurality of ESD current profiles may comprise determining an area difference bounded by a current profile for the current data input of interest and each of the plurality of ESD current profiles, wherein the origination location of the ESD on the solar panel corresponds to the location on the solar panel whose corresponding ESD current profile has the least bounded area difference relative to the current profile for the current data input from the power bus current probe.

If the surface is a symmetrical solar panel that comprises a plurality of solar cells, wherein the solar panel has n axes of symmetry (n≧1), the programmable computer device receives actual current data from: (i) a power bus current probe that senses current conducted by a power bus, wherein the power bus is connected to the plurality of current strings; and (ii) a plurality of string current probes, wherein each of the plurality of string current probes is connected to a separate one of a plurality of conductive strings, wherein the plurality of conductive strings are connected to respective, discrete groups of the plurality of solar cells, wherein the plurality of conductive strings are connected to the power bus. In addition, the step of comparing the received actual current data to the plurality of ESD current profiles comprises determining at least the 2n most probable ESD origination locations by comparing the current data input from the power bus current probe to the plurality of ESD current profiles, wherein the 2n most probable ESD origination locations correspond to the solar panel locations whose corresponding ESD current profiles have the 2n least bounded area differences relative to a current profile for the current data input from the power bus current probe. Further, the steps of determining the origination location of the ESD comprises determining the ESD origination location from the 2n most probable ESD origination locations based on current input data from the plurality of string current probes.

Reference throughout the specification to "various embodiments," "some embodiments," "one embodiment," "an embodiment," and the like means that a particular feature, structure, or characteristic described in connection with the embodiment is included in at least one embodiment. Thus, appearances of the phrases "in various embodiments," "in some embodiments," "in one embodiment," "in an embodiment," and the like in places throughout the specification are not necessarily all referring to the same embodiment. Furthermore, the particular features, structures, or characteristics may be combined in any suitable manner in one or more embodiments. Thus, the particular features, structures, or characteristics illustrated or described in connection with one embodiment may be combined, in whole or in part, with the features structures, or characteristics of one or more other embodiments without limitation.

The examples presented herein are intended to illustrate potential and specific implementations of the embodiments. It can be appreciated that the examples are intended primarily for purposes of illustration for those skilled in the art. No particular aspect or aspects of the examples is/are intended to limit the scope of the described embodiments. The figures and descriptions of the embodiments have been simplified to illustrate elements that are relevant for a clear understanding of the embodiments, while eliminating, for purposes of clarity, other elements.

While various embodiments have been described herein, it should be apparent that various modifications, alterations, and adaptations to those embodiments may occur to persons skilled in the art with attainment of at least some of the advantages. The disclosed embodiments are therefore intended to include all such modifications, alterations, and adaptations without departing from the scope of the embodiments as set forth herein.

What is claimed is:

1. A computer system for determining the origination location of an electrostatic discharge (ESD) on a surface, the computer system comprising:
    at least one processor;
    a data store in communication with the at least one processor, wherein the data store stores a plurality of ESD current profiles, each ESD profile corresponding to a different location on the surface; and
    at least one memory unit in communication with the at least one processor, wherein the at least one memory unit includes instructions that are executed by the at least one processor such that the at least one processor is programmed to:
        receive actual current data indicative of time-varying current conducted by the surface;

compare the actual current data to the plurality of ESD current profiles; and determine the origination location of the ESD on the surface based on the comparison.

2. The computer system of claim 1, wherein the at least one processor is further programmed to detect ESD on the surface based on the actual current data.

3. The computer system of claim 1, wherein the surface is flat.

4. The computer system of claim 1, wherein the surface is non-flat.

5. The computer system of claim 3, wherein the surface comprises a solar panel, the solar panel comprising an array of solar cells.

6. The computer system of claim 1, wherein the at least one processor is programmed to compare the actual current data to the plurality of ESD current profiles by determining an area bounded between a current profile for the actual current data to each of the plurality of ESD current profiles.

7. The computer system of claim 6, wherein the at least one processor is programmed to determine the origination location of the ESD on the surface by determining that the location on the surface corresponding to the ESD current profile closest to the current profile for the actual current data is the ESD origination location.

8. An apparatus comprising:
at least one solar panel, the at least one solar panel comprising:
a plurality of solar cells; and
a power bus connected to strings of solar cells, wherein the power bus conducts current generated by the plurality of solar cells;
at least one power bus current probe that senses current in the power bus of the at least one solar panel;
an ESD detection/location system comprising at least one processor and at least one memory unit, wherein the ESD detection/location system is capable of receiving current data indicative of current on the at least one power bus, wherein the ESD detection/location system is programmed to determine an origination location of ESD on the at least one solar panel by comparing current data input from the at least one power bus current probe to a plurality of ESD current profiles that are stored in a data store of the ESD detection/location system, each ESD profile corresponding to a different location on the at least one solar panel.

9. The apparatus of claim 8, further comprising a power source connected to the power bus.

10. The apparatus of claim 8, wherein the at least one solar panel is flat.

11. The apparatus of claim 8, wherein the at least one solar panel is non-flat.

12. The apparatus of claim 8, wherein:
the at least one solar panel is asymmetrical; and
the ESD detection/location system is programmed to compare the current data input from the at least one power bus current probe to the plurality of ESD current profiles by determining an area bounded between a current profile for the current data input from the at least one power bus current probe and each of the plurality of ESD current profiles, wherein the origination location of the ESD on the at least one solar panel corresponds to the location on the at least one solar panel whose corresponding ESD current profile has the least bounded area difference relative to the current profile for the current data input from the at least one power bus current probe.

13. The apparatus of claim 12, wherein the ESD detection/location system is further programmed to detect ESD on the at least one solar panel based on the current data input from the at least one power bus current probe.

14. The apparatus of claim 8, wherein:
the at least one solar panel is symmetrical, having n axes of symmetry, wherein $n \geq 1$;
the apparatus further comprises:
a plurality of conductive strings connected to respective, discrete groups of the plurality of solar cells of the at least one solar panel, wherein the plurality of conductive strings are connected to the power bus; and
a plurality of string current probes, wherein each of the plurality of string current probes is connected to a separate one of the plurality of conductive strings; and
the ESD detection/location system is programmed to determine the origination location of the ESD by:
determining at least the 2n most probable ESD origination locations by comparing the current data input from the at least one power bus current probe to the plurality of ESD current profiles, wherein the 2n most probable ESD origination locations correspond to the 2n solar panel locations whose corresponding ESD current profiles have the 2n least bounded area differences relative to a current profile for the current data input from the at least one power bus current probe; and
determining the ESD origination location from the 2n most probable ESD origination locations based on current input data from the plurality of string current probes.

15. The apparatus of claim 14, wherein the ESD detection/location system is further programmed to detect ESD on the at least one solar panel based on the current data input from the at least one power bus current probe.

16. A computer-implemented method for determining an origination location of electrostatic discharge (ESD) on a surface, the method comprising:
receiving and storing actual current data indicative of time-varying current on the surface by a programmable computer device;
comparing by the programmable computer device the received actual current data to a plurality of ESD current profiles stored in a data store for the programmable computer device, wherein each ESD profile corresponds to a different location on the surface; and
determining by the programmable computer device the origination location of the ESD on the surface based on the comparison.

17. The method of claim 16, further comprising detecting by the programmable computer device ESD on the surface based on the actual current data.

18. The method of claim 17, wherein:
the surface is an asymmetrical solar panel that comprises a plurality of solar cells;
the programmable computer device receives current data from a power bus current probe that senses current conducted by a power bus, wherein the power bus is connected to the plurality of solar cells; and
the step of comparing the received actual current data to the plurality of ESD current profiles comprises determining an area difference bounded by a current profile for the current data input of interest and each of the plurality of ESD current profiles, wherein the origination location of the ESD on the solar panel corresponds to the location on the solar panel whose corresponding ESD current profile has a least bounded area difference relative to the current profile for the current data input from the power bus current probe.

19. The method of claim 17, wherein:
the surface is a symmetrical solar panel that comprises a plurality of solar cells, wherein the solar panel has n axes of symmetry, wherein $n \geq 1$;
the programmable computer device receives actual current data from:
  a power bus current probe that senses current conducted by a power bus, wherein the power bus is connected to the plurality of current strings; and
  a plurality of string current probes, wherein each of the plurality of string current probes is connected to a separate one of a plurality of conductive strings, wherein the plurality of conductive strings are connected to respective, discrete groups of the plurality of solar cells, wherein the plurality of conductive strings are connected to the power bus;

the step of comparing the received actual current data to the plurality of ESD current profiles comprises determining at least the 2n most probable ESD origination locations by comparing the current data input from the power bus current probe to the plurality of ESD current profiles, wherein the 2n most probable ESD origination locations correspond to the solar panel locations whose corresponding ESD current profiles have the 2n least bounded area differences relative to a current profile for the current data input from the power bus current probe; and
the step of determining the origination location of the ESD comprises determining the ESD origination location from the 2n most probable ESD origination locations based on current input data from the plurality of string current probes.

* * * * *